(12) United States Patent
Li et al.

(10) Patent No.: US 11,470,701 B2
(45) Date of Patent: Oct. 11, 2022

(54) ALTERNATING CURRENT LED FILAMENT

(71) Applicant: RUIJIN DEYU OPTOELECTRONICS CO., LTD., Ruijin (CN)

(72) Inventors: Yuanming Li, Ruijin (CN); Yuanjian Li, Ruijin (CN)

(73) Assignee: RUIJIN DEYU OPTOELECTRONICS CO., LTD., Ruijin (CN)

( * ) Notice: Subject to any disclaimer, the term of this patent is extended or adjusted under 35 U.S.C. 154(b) by 0 days.

(21) Appl. No.: 17/179,321

(22) Filed: Feb. 18, 2021

(65) Prior Publication Data

US 2022/0095432 A1 Mar. 24, 2022

(30) Foreign Application Priority Data

Sep. 22, 2020 (CN) .......................... 202022082013.1
Sep. 22, 2020 (CN) .......................... 202022082352.X
Sep. 30, 2020 (CN) .......................... 202022217458.6

(51) Int. Cl.
*H05B 45/40* (2020.01)

(52) U.S. Cl.
CPC .................... *H05B 45/40* (2020.01)

(58) Field of Classification Search
CPC ........ H05B 45/37; H05B 45/39; H05B 45/40; H05B 45/52; H05B 45/54
See application file for complete search history.

(56) References Cited

U.S. PATENT DOCUMENTS

| | | | |
|---|---|---|---|
| 2006/0158130 A1* | 7/2006 | Furukawa | H05B 45/40 315/200 R |
| 2009/0294780 A1* | 12/2009 | Chou | F21K 9/20 257/88 |
| 2010/0295458 A1* | 11/2010 | Cheng | H05B 45/48 315/185 R |
| 2010/0320892 A1* | 12/2010 | Yu | F21V 29/71 313/46 |
| 2014/0301073 A1* | 10/2014 | Miskin | F21V 23/005 362/249.06 |
| 2017/0202061 A1* | 7/2017 | Allen | F21V 23/005 |
| 2019/0169497 A1* | 6/2019 | Tsang | F21K 9/90 |
| 2019/0306940 A1* | 10/2019 | Miskin | H05B 45/10 |
| 2021/0127468 A1* | 4/2021 | Li | H05B 45/40 |

* cited by examiner

Primary Examiner — Tung X Le
(74) Attorney, Agent, or Firm — Bayramoglu Law Offices LLC (57) ABSTRACT

An alternating current LED filament includes a base board, rectifier diodes and light-emitting diodes. Two ends of the base board are provided with connecting terminals, and two conductive circuits are arranged on the base board. Two ends of each of the two conductive circuits are respectively connected to an external power supply through an at least one rectifier diode of the rectifier diodes. The rectifier diodes at two ends of a same conductive circuit are arranged in a reversed direction, the rectifier diodes connected to different conductive circuits on a same connecting terminal are arranged in the reversed direction, and the light-emitting diodes are connected to the two conductive circuits. A connecting terminal of the connecting terminals is connected to a corresponding conductive circuit through the at least one rectifier diode to improve a reverse withstand voltage capability.

8 Claims, 7 Drawing Sheets

ALTERNATING CURRENT LED FILAMENT

CROSS REFERENCE TO THE RELATED APPLICATIONS

This application is based upon and claims priority to Chinese Patent Application No. 202022082013.1, filed on Sep. 22, 2020, Chinese Patent Application No. 202022082352.X, filed on Sep. 22, 2020, and Chinese Patent Application No. 202022217458.6, filed on Sep. 30, 2020, the disclosure of which is incorporated herein by reference in its entirety.

TECHNICAL FIELD

The present disclosure relates to the field of LED lamps, in particular to an alternating current LED filament.

BACKGROUND

LED lamps are concerned and are being promoted and applied as a new generation of light source, due to its advantages of energy saving, durability and environmental protection. In view of the traditional direct current (DC) LED lighting device, since it requires driving power supply to connect the external alternating current supply, which leads to high manufacturing cost and affects the life of lamps, and also causes excessive power consumption and other problems.

SUMMARY

The objective of the present disclosure is to overcome the shortcomings of the prior art and provide an alternating current (AC) LED filament.

The technical solution adopted by the present disclosure is as follows:

An alternating current LED filament, which includes a base board, a rectifier diode and a light-emitting diode. Two ends of the base board are provided with connecting terminals, and two conductive circuits are arranged on the base board. Two ends of each of the two conductive circuits are connected with an external power supply through at least one rectifier diode respectively; the rectifier diodes at two ends of the same conductive circuit are arranged in reversed direction, the rectifier diodes connected to different conductive circuits on the same connecting terminal are arranged in reversed direction, and the light-emitting diodes are connected to two conductive circuits.

As a preferred embodiment, at least one end of the light-emitting diode is connected to the two conductive circuits through a first current-limiting resistor.

As a preferred embodiment, at least one connecting terminal is connected to the external power supply through a second current-limiting resistor.

As a preferred embodiment, at least one end of the light-emitting diode is connected to the two conductive circuits through a first current-limiting resistor, and at least one connecting terminal is connected to the external power supply through a second current-limiting resistor.

As a preferred embodiment, the first current-limiting resistor and the second current-limiting resistor are chip resistors.

As a preferred embodiment, the light-emitting diode is connected with a constant current IC, and then connected with the conductive circuit.

As a preferred embodiment, two or more of the light-emitting diodes are connected in parallel with each other or connected in series in the same direction.

As a preferred embodiment, the base board is a ceramic circuit board.

As a preferred embodiment, the conductive circuit is a printed circuit.

The present disclosure adopts the above technical solution to print two printed circuits on the ceramic base board, and the rectifier circuit is composed of a plurality of rectifier diodes, which are connected to the printed circuit and the connecting terminal, and the light-emitting diodes are connected between the two printed circuits to realize the LED filament, without connecting the driving power supply, the light-emitting lighting of the external AC power supply can be directly used. Such that the manufacturing cost of the LED lamps is reduced. The connecting terminal of the AC LED filament is connected with the corresponding conductive circuit through the rectifier diode, which greatly improves the reverse voltage withstand capacity of the filament and enhances the reliability of the product. The present disclosure has the advantages in simple structure, low cost and high production efficiency, and is suitable for AC power supply occasions. The cost of the lamp produced by the present disclosure is 40%-60% lower than that of other lamps requiring AC/DC conversion driving power supply.

BRIEF DESCRIPTION OF THE DRAWINGS

The present disclosure is further described in detail in combination with the drawings and the specific embodiments.

DETAILED DESCRIPTION OF THE EMBODIMENTS

The present disclosure is introduced by the following embodiments

Embodiment 1

Figure 1:
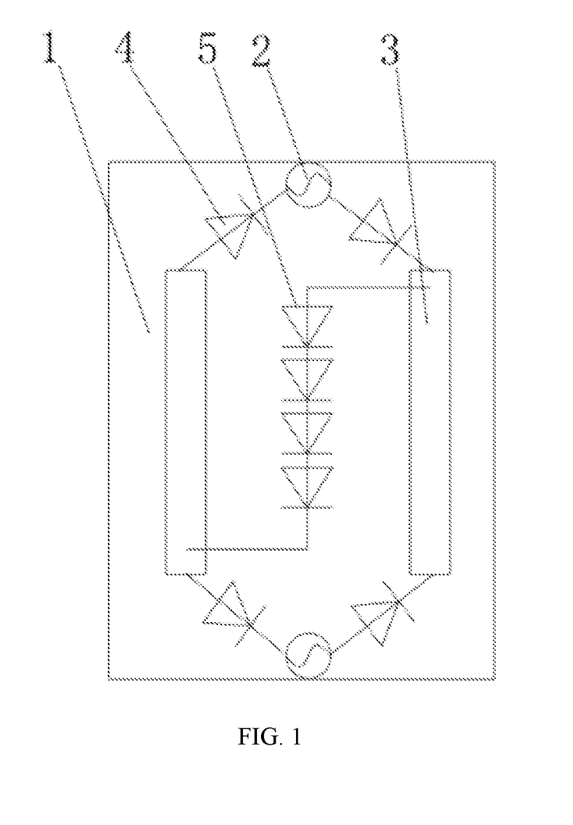
FIG. 1 is the structural diagram of the AC LED filament in the first embodiment of the present disclosure.

As shown in FIG. 1, this embodiment discloses an AC LED filament, which includes a base board 1, two connecting terminals 2 are provided at two ends of the base board 1. Two conductive circuits 3 are provided on the base board 1, each end of each conductive circuit 3 is connected with the connecting terminal 2 through at least one rectifier diode 4. The rectifier diodes 4 at both ends of the same conductive line 3 are reversely set, and different lines are connected on the same terminal 2 The rectifying diodes 4 of the conductive lines 3 are arranged in opposite directions to each other, and two or more light-emitting diodes connecting the two conductive lines 3 are arranged between the two conductive lines 3. The rectifier diodes 4 at two ends of the same conductive circuit 3 are arranged in reversed direction, and the rectifier diodes 4 connected to different conductive circuits 3 on the same connecting terminal 2 are arranged in reversed direction. And two or more light-emitting diodes are connected to two conductive circuits 3, which are provided between two conductive circuits 3.

Specifically, the working current of light-emitting diodes is relatively small. The working current of low-power light-emitting diodes is about 10 mA to 20 mA, and that of high-power light-emitting diodes is about 1 A, while the working current of rectifier diodes can reach tens of amperes or even hundreds of amperes. The reverse breakdown voltage of LED is relatively small, generally only about 50V, while the reverse breakdown voltage of rectifier diode can reach several thousand voltages. The present disclosure adopts a plurality of rectifier diodes to form a rectifier circuit, which is connected with the printed circuit and the connecting terminal, and the light-emitting diode is connected between the two printed circuits, so as to realize the LED filament without connecting the driving power supply, which can directly use the external AC power supply for lighting. The reverse breakdown voltage of rectifier diode is large, which is beneficial to protect the whole circuit.

The present disclosure adopts the rectifier diode for rectification, so that the working current of the filament is effectively improved, and the reverse voltage withstand capacity is also greatly improved at the same time, which reduces the manufacturing cost of the lamp and improves the reliability of the product.

Two or more LEDs are connected in series in the same direction.

The base board 1 is a ceramic circuit board.

The conductive circuit 3 is a printed circuit.

In the first embodiment, two printed circuits are printed on the ceramic base board, and the rectifier circuit is composed of a plurality of rectifier diodes 4, which are connected to the printed circuit and the connecting terminal, and two or more light-emitting diodes are connected in series in the same direction between the two printed circuits to realize the lighting by using of the AC power supply. The present disclosure has the advantages in simple structure, low cost and high production efficiency, and is suitable for AC power supply occasions. The cost of the lamp produced by the present disclosure is 30%-50% lower than that of other lamps requiring AC/DC conversion power supply.

Embodiment 2

Figure 2:
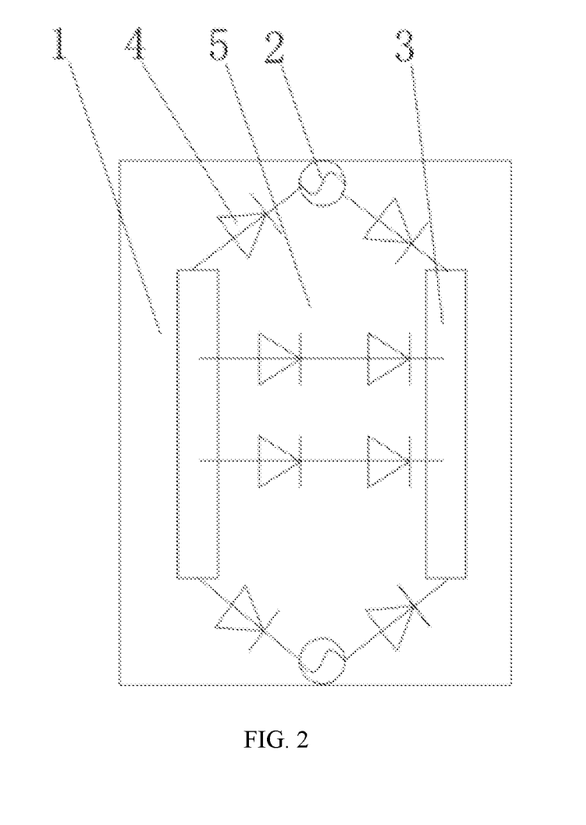
FIG. 2 is the structural diagram of the AC LED filament in the second embodiment of the present disclosure.

As shown in FIG. 2, the difference between the second embodiment and the first embodiment is that two or more light-emitting diodes are in parallel in the same direction.

In the second embodiment, two printed circuits are printed on the ceramic base board, and the rectifier circuit is composed of a plurality of rectifier diodes 4, which are connected to the printed circuit and the connecting terminal, and two or more light-emitting diodes are connected in parallel in the same direction between the two printed circuits to realize the lighting by using of the AC power supply. The present disclosure has the advantages in simple structure, low cost and high production efficiency, and is suitable for AC power supply occasions. The cost of the lamp produced by the present disclosure is 30%-50% lower than that of other lamps requiring AC/DC conversion power supply.

Embodiment 3

Figure 3:
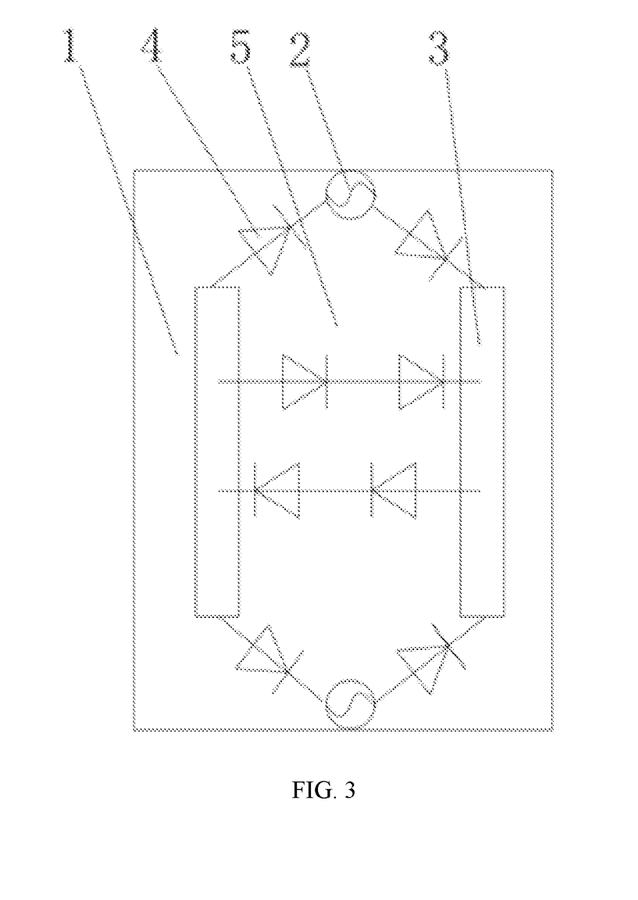
FIG. 3 is the structural diagram of the AC LED filament in the third embodiment of the present disclosure.

As shown in FIG. 3, the difference between the third embodiment and the first embodiment and the second embodiment is that two or more light-emitting diodes are reversely connected in parallel.

In the third embodiment, two printed circuits are printed on the ceramic base board, and the rectifier circuit is composed of a plurality of rectifier diodes 4, which are connected to the printed circuit and the connecting terminal, and two or more light-emitting diodes are reversely connected in parallel between the two printed circuits to realize the lighting by using of the AC power supply. The present disclosure has the advantages in simple structure, low cost and high production efficiency, and is suitable for AC power supply occasions. The cost of the lamp produced by the present disclosure is 30%-50% lower than that of other lamps requiring AC/DC conversion power supply.

Embodiment 4

Figure 4:
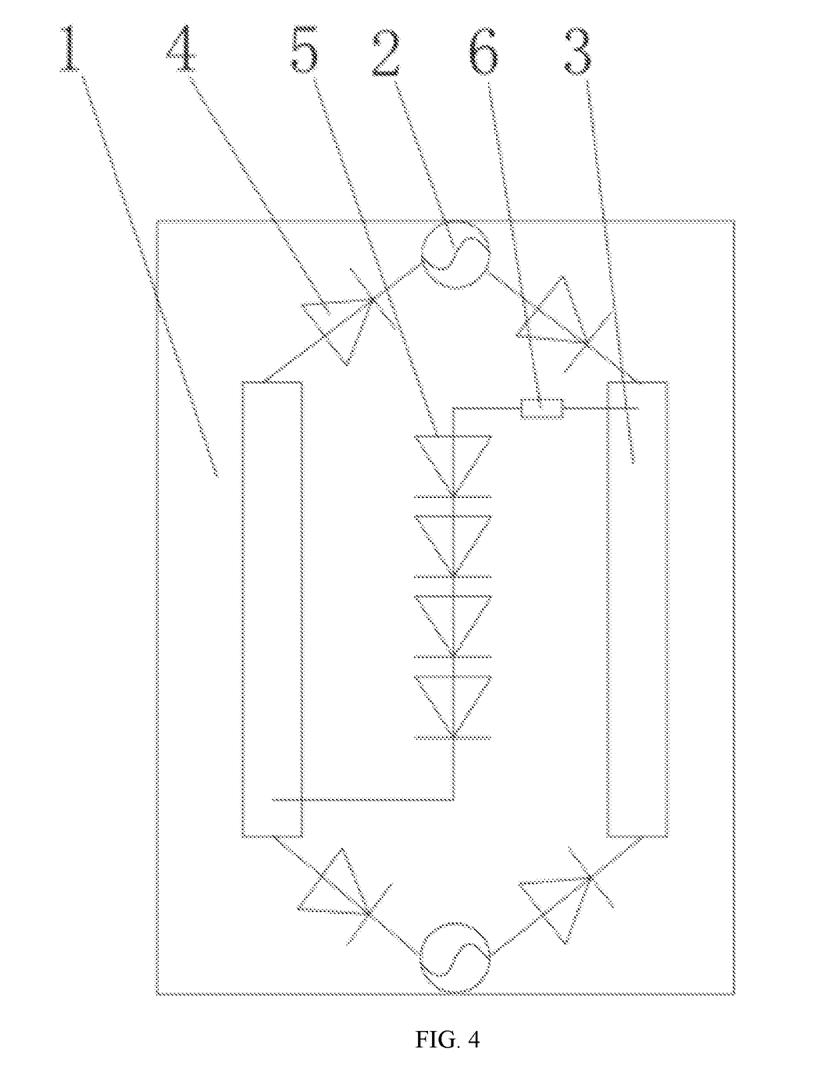
FIG. 4 is the structural diagram of the AC LED filament in the fourth embodiment of the present disclosure.

As shown in FIG. 4, the fourth embodiment discloses an AC LED filament, which includes a base board 1, a rectifier diode 4 and a light-emitting diode 5. Two ends of the base board 1 are provided with a connecting terminal 2, and the base board 1 is provided with two conductive circuits 3. Two ends of each conductive circuit 3 are respectively connected with one connecting terminal 2 through at least one rectifier diode 4. The rectifier diodes 4 at both ends of the same conductive circuit 3 are arranged in reversed direction, the rectifier diodes 4 connected with different conductive circuits 3 on the same connecting terminal 2 are arranged in reversed direction to each other, and the light-emitting diodes 5 are connected between two conductive circuits 3. After a plurality of light-emitting diodes are connected in series, at least one end is connected with two conductive circuits through the first current-limiting resistor 6, and the connecting terminal is connected with an external AC power supply.

In the fourth embodiment, two printed circuits are printed on the ceramic base board, and the rectifier circuit is composed of a plurality of rectifier diodes 4, which are connected to the printed circuit and the connecting terminal, and two or more light-emitting diodes are connected in series in the same direction between the two printed circuits to realize the lighting by using of the AC power supply. Meanwhile, by adding the first current-limiting resistor 6 at one end of the light-emitting diodes, the filament can be directly connected to the AC power supply, whether it is 120V or 220V, under the action of the current-limiting resistor, the current will not exceed the rated working current of the light-emitting diode, which further improves the reliability of the product. Because the filament structure can be directly connected to the power supply, there is no need to install the driving power supply, which is convenient for the subsequent processing of lamps. It is conducive to the mechanized automatic processing of lamps, which greatly improves the processing efficiency and further reduces the production cost.

The present disclosure adopts the above technical scheme, has simple structure, low cost and high production efficiency, is suitable for AC power supply occasions, further improves the reliability of the product and reduces the production cost. The cost of the lamp produced by the disclosure is 40-60% lower than that of other lamps requiring AC/DC conversion power supply.

Embodiment 5

Figure 5:
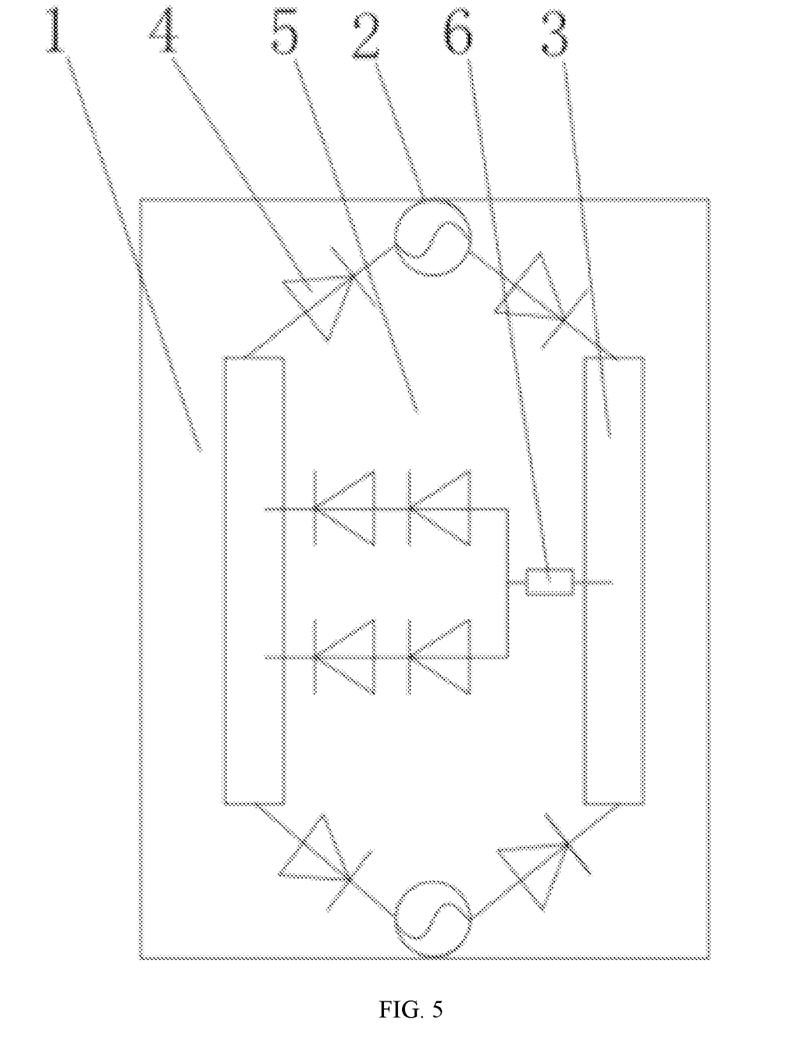
FIG. 5 is the structural diagram of the AC LED filament in the fifth embodiment of the present disclosure.

As shown in FIG. 5, the difference between the fifth embodiment and the fourth embodiment is that after more than two light-emitting diodes are connected in parallel in the same direction, at least one end is connected with two conductive circuits through the first current-limiting resistor 6.

In the fifth embodiment, two printed circuits are printed on the ceramic base board, and the rectifier circuit is composed of a plurality of rectifier diodes 4, and more than two light-emitting diodes are connected in series in the same direction between the two printed circuits to realize the lighting by using of AC power supply.

At the same time, by adding a second current-limiting resistor 7 to any connecting terminal, the filament can be directly connected to the AC power supply, whether it is 120V or 220V. Under the action of the current limiting resistor, the current will not exceed the rated working current of the light-emitting diode, which further improves the reliability of the product. Because the filament structure can be directly connected to the power supply, there is no need to install the driving power supply, which is convenient for the subsequent processing of lamps. It is conducive to the mechanized automatic processing of lamps, which greatly improves the processing efficiency and further reduces the production cost.

The present disclosure has the advantages in simple structure, low cost and high production efficiency, and is suitable for AC power supply occasions. The price of finished product of the present disclosure is 40%-60% lower than that of other lamps requiring AC/DC conversion driving power supply.

Embodiment 6

Figure 6:
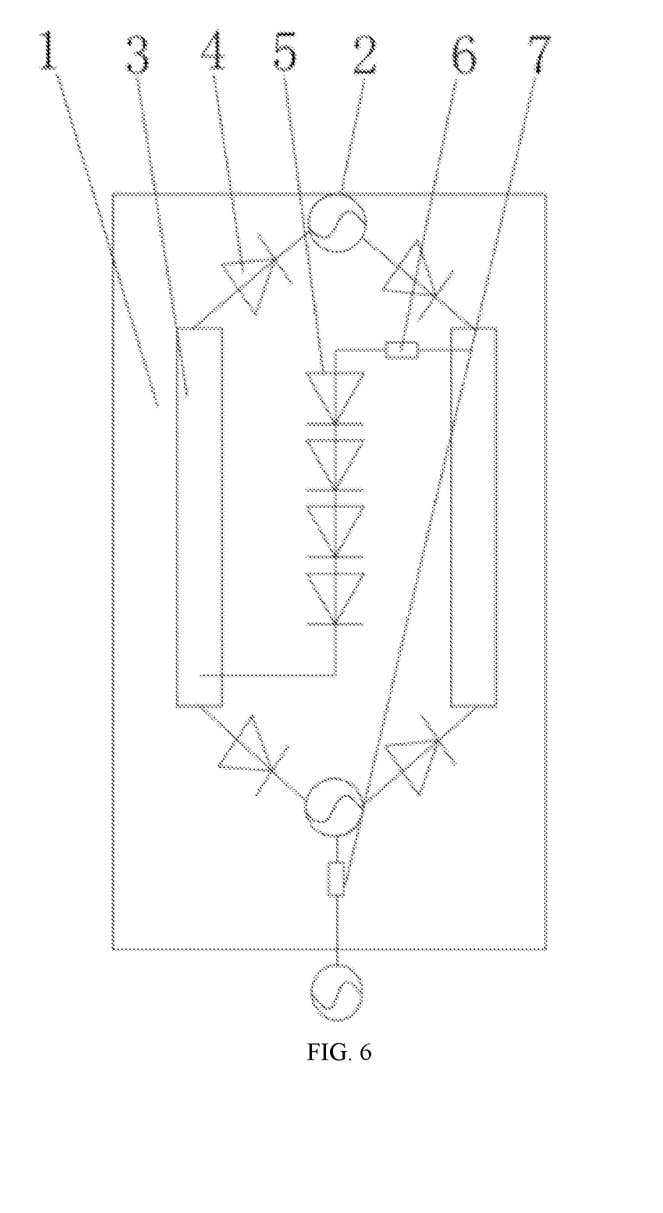
FIG. 6 is the structural diagram of the AC LED filament in the sixth embodiment of the present disclosure.

As shown in FIG. 6, the difference between the sixth embodiment and the first embodiment is that at least one end of the light-emitting diode is connected with two conductive circuits through the first current-limiting resistor 6, and at least one connecting terminal is connected to the external AC power supply through the second current-limiting resistor 7.

In this embodiment 6, two printed circuits are printed on the ceramic base board, and the rectifier circuit is composed of a plurality of rectifier diodes 4. At the same time, by adding the first current-limiting resistance 6 and the second current-limiting resistance 7, the filament can be directly connected to the AC power supply, whether it is 120V or 220V. Under the action of the current limiting resistors, the current will not exceed the rated working current of the light-emitting diode, which further improves the reliability of the product. Because the filament structure can be directly connected to the power supply, there is no need to install the driving power supply, which is convenient for the subsequent processing of lamps. It is conducive to the mechanized automatic processing of lamps, which greatly improves the processing efficiency and further reduces the production cost.

The present disclosure has the advantages in simple structure, low cost and high production efficiency, and is suitable for AC power supply occasions. The price of finished product of the present disclosure is 40%-60% lower than that of other lamps requiring AC/DC conversion driving power supply.

Embodiment 7

Figure 7:
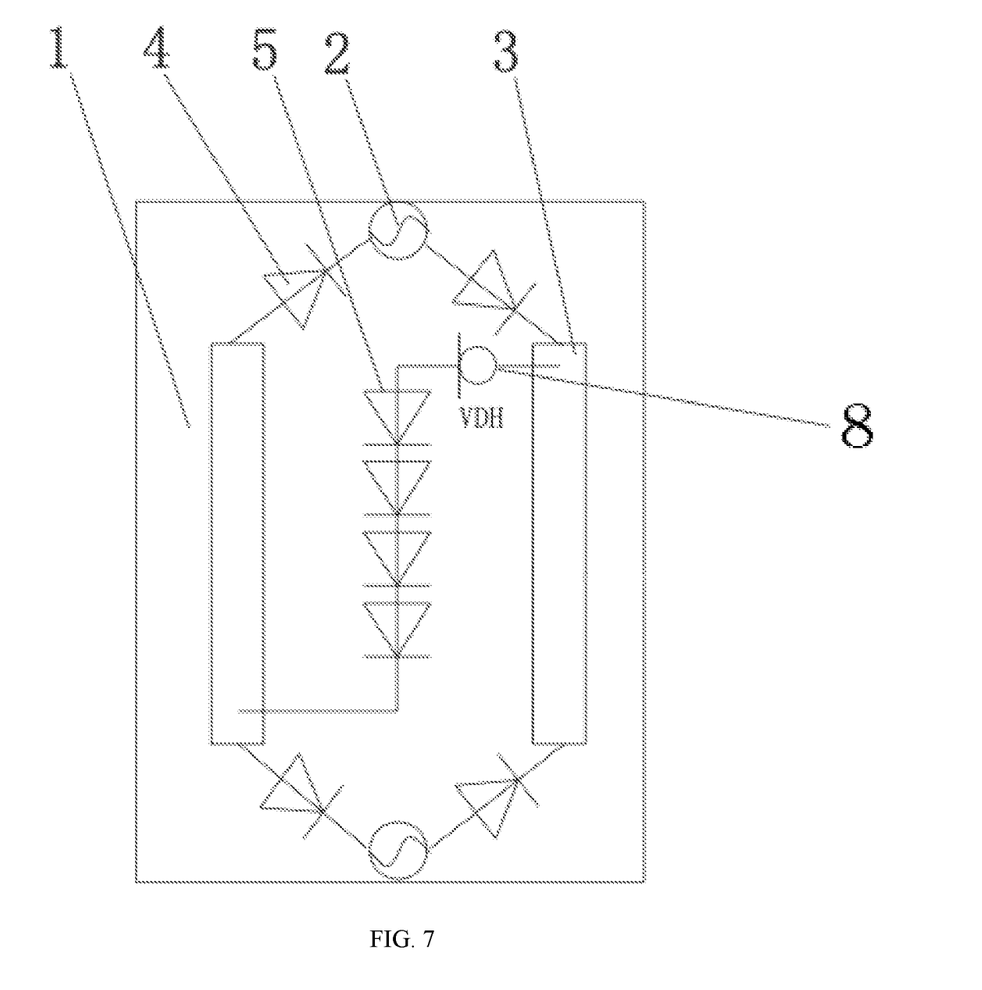
FIG. 7 is the structural diagram of the AC LED filament in the seventh embodiment of the present disclosure.

As shown in FIG. 7, the seventh embodiment discloses an AC LED filament, which includes a base board 1, a rectifier diode 4 and a light-emitting diode 5. Both ends of the base board 1 are provided with a connecting terminal 2, and the base board 1 is provided with two conductive circuits 3. Both ends of each conductive circuit 3 are connected with the connecting terminal 2 through at least one rectifier diode 4, and the rectifier diodes 4 at both ends of the same conductive circuit 3 are arranged in reversed direction. The rectifier diodes 4 connected with different conductive circuits 3 on the same connecting terminal 2 are arranged in reversed direction to each other, and the light-emitting diodes 5 are connected between two conductive circuits 3. The light-emitting diode 5 is connected with a constant current IC 8, then connecting with the conductive circuit.

In the seventh embodiment, two printed circuits are printed on the ceramic base board, and the rectifier circuit is composed of a plurality of rectifier diodes 4. The light-emitting diode 5 is connected to a constant current IC 8, and then connected to the printed circuit. The current management is controlled by the constant current IC 8, so that the filament can be directly connected to 120V or 220V AC power supply, which can normal lighting, so as to realize the lighting by using of the AC power supply. The constant current IC can manage the current and temperature, which ensures that the current will not exceed the rated working current of light-emitting diode, and further improves the reliability of the product. Because the filament structure can be directly connected to the power supply, there is no need to install the driving power supply, which is convenient for the subsequent processing of lamps. It is conducive to the mechanized automatic processing of lamps, which greatly improves the processing efficiency and further reduces the production cost.

The present disclosure has the advantages in simple structure, low cost and high production efficiency, and is suitable for AC power supply occasions. The price of finished product of the present disclosure is 40%-60% lower than that of other lamps requiring AC/DC conversion driving power supply.

What is claimed is:

1. An alternating current LED filament, comprising a ceramic base board, at least four rectifier diodes, and light-emitting diodes, two ends of the base board are provided with first and second connecting terminals, first and second elongate printed conductive circuits are arranged on the ceramic base board, each end of each of the two conductive circuits are connected to an external alternating current (AC) power supply through the rectifier diodes, respectively; at least two of the rectifier diodes from each of the two ends of a same conductive circuit are arranged in a reversed direction, at least two of the rectifier diodes connected to different conductive circuits on a same connecting terminal are arranged in the reversed direction, and the light-emitting diodes are connected to the two conductive circuits;

a first end of the first elongate printed conductive circuit is connected to the first connecting terminal of the AC power supply by a first of the at least four rectifier diodes arranged with the anode of the first rectifier diode in a direction of the first connecting terminal and the cathode of the first rectifier diode in a direction of the first end of the first elongate printed conductive circuit;

a second end of the first elongate printed conductive circuit is connected to the second connecting terminal of the AC power supply by a second of the at least four rectifier diodes arranged with the anode of the second rectifier diode in a direction of the second connecting terminal and the cathode of the second rectifier diode in a direction of the second end of the first elongate printed conductive circuit;

a first end of the second elongate printed conductive circuit is connected to the first connecting terminal of the AC power supply by a third of the at least four rectifier diodes arranged with the cathode of the third rectifier diode in a direction of the of the first connecting terminal of the AC power supply and the anode of the third rectifier diode in a direction of the first end of the second elongate printed conductive circuit; and a second end of the second elongate printed conductive circuit is connected to the second connecting terminal of the AC power supply by a fourth of the at least four rectifier diodes arranged with the cathode of the fourth rectifier diode in a direction of the second connecting terminal of the AC power supply and the anode of the fourth rectifier diode in a direction of the second end of the second elongate printed circuit;

wherein the light emitting diodes are arranged with the anodes in a direction of the first elongate printed conductive circuit and each light emitting diode is electrically attached to the first elongate printed conductive circuit at a point intermediate the first and second end of the first elongate printed conductive circuit, and the light emitting diodes are arranged with the cathodes in a direction of the second elongate printed conductive circuit and each light emitting diode is electrically attached to the second elongate printed conductive circuit at a point intermediate the first and second end of the second elongate printed conductive circuit;

wherein at least one end of each of the light-emitting diodes is connected to the two conductive circuits through a first current-limiting resistor or at least one connecting terminal of the connecting terminals is connected to the external AC power supply through a second current-limiting resistor.

2. The alternating current LED filament according to claim 1, wherein the first current-limiting resistor is a chip resistor.

3. The alternating current LED filament according to claim 1, at least one end of each of the light-emitting diodes is connected to the first or second elongate printed conductive circuits through a first current-limiting resistor, and at least one connecting terminal of the connecting terminals is connected to the external AC power supply through a second current-limiting resistor.

4. The alternating current LED filament according to claim 3, the second current-limiting resistor is a chip resistor.

5. The alternating current LED filament according to claim 1, the second current-limiting resistor is a chip resistor.

6. The alternating current LED filament according to claim 1, wherein each of the light-emitting diodes is connected to a constant current IC that is connected to the first or second elongated printed conductive circuits.

7. The alternating current LED filament according to claim 1, wherein two or more of the light-emitting diodes are connected in parallel with each other.

8. The alternating current LED filament according to claim 1, wherein two or more of the light-emitting diodes are connected in series in a same direction.

* * * * *